United States Patent
Wang

(10) Patent No.: US 9,445,512 B2
(45) Date of Patent: Sep. 13, 2016

(54) HOLDER HAVING ADJUSTABLE CLAMPING ORIENTATION

(71) Applicant: AMOUNT INC., New Taipei (TW)

(72) Inventor: Teng Wang, New Taipei (TW)

(73) Assignee: AMOUNT INC., New Taipei (TW)

( * ) Notice: Subject to any disclaimer, the term of this patent is extended or adjusted under 35 U.S.C. 154(b) by 0 days.

(21) Appl. No.: 14/882,744

(22) Filed: Oct. 14, 2015

(65) Prior Publication Data

US 2016/0174396 A1 Jun. 16, 2016

(30) Foreign Application Priority Data

Dec. 15, 2014 (TW) .............................. 103143649 A

(51) Int. Cl.
| | |
|---|---|
| *F24H 9/06* | (2006.01) |
| *H05K 5/02* | (2006.01) |
| *F16M 13/02* | (2006.01) |
| *F16B 2/10* | (2006.01) |
| *B60R 11/02* | (2006.01) |
| *F16C 11/10* | (2006.01) |
| *B60R 11/00* | (2006.01) |

(52) U.S. Cl.
CPC .............. *H05K 5/0204* (2013.01); *B60R 11/02* (2013.01); *F16B 2/10* (2013.01); *F16C 11/106* (2013.01); *F16M 13/022* (2013.01); *B60R 2011/0059* (2013.01); *B60R 2011/0085* (2013.01); *B60R 2011/0089* (2013.01)

(58) Field of Classification Search
CPC .................... H05K 5/0204; B60R 2011/0085; B60R 11/02; B60R 2011/0089; F16C 11/106; F16B 2/10
See application file for complete search history.

(56) References Cited

U.S. PATENT DOCUMENTS

| | | | | |
|---|---|---|---|---|
| 7,441,734 | B2 * | 10/2008 | Liou ....................... | B60R 11/02 248/205.5 |
| 8,740,161 | B2 * | 6/2014 | Hsu ........................ | F16M 11/14 248/181.1 |
| 2007/0152116 | A1 * | 7/2007 | Madsen ................. | F16M 11/14 248/181.1 |

* cited by examiner

Primary Examiner — Amy Sterling
(74) Attorney, Agent, or Firm — Bacon & Thomas, PLLC

(57) ABSTRACT

The present invention is to provide a holder having an adjustable clamping orientation, which includes a clamping assembly having a first clamping plate extended forwardly from a front end thereof and movably connected with a second clamping plate to form a clamping head for clamping a plate, a support assembly having a front end pivoted to a rear end of the clamping assembly and a side edge pivoted to a support arm extended therefrom so that a free end of the support arm is rotatable in a direction of away from or close to the clamping assembly, and a holding seat having a front end rotatably fastened with a rear end of the support assembly and a positioning member disposed at a rear end thereof, so that a mobile electronic device can be firmly positioned at the positioning member and adjusted to an expected orientation with respect to the plate.

18 Claims, 4 Drawing Sheets

HOLDER HAVING ADJUSTABLE CLAMPING ORIENTATION

FIELD OF THE INVENTION

The present disclosure relates to a mobile electronic device holder, in particular, to a holder having an adjustable clamping orientation.

BACKGROUND OF THE INVENTION

As technologies are greatly developed in global countries and the microcomputer and mobile broadband networking technologies are more fully developed, various mobile electronic devices have lower manufacturing costs and compacter and smaller appearance designs, compared with conventional devices. Therefore, various mobile electronic devices having networking and multimedia functions come into the market, such as common mobile electronic device including smart phone, PDA, Tablet PC, and E-book reader, etc. Compared with a personal computer, the mobile network device can be carried easily and has various functions of, such as, taking picture, performing video call, playing music, processing paperwork, receiving and sending email, downloading and playing streaming media, etc., so as to meet the user's various demands. That is the reason that the various mobile electronic devices almost become one of daily commodities for people.

However, while in use, the user must hold the mobile electronic device by one hand and operate the mobile electronic device by other hand. Under a condition of using for long time, the user's hand is easy to feel tired because the user's hand must be suspended for holding the mobile electronic device having a certain weight. To solve the problem, the manufacturer designs a mobile electronic device holder. While being operated in a car, the mobile electronic device can be fixed on the holder and the user's two hands can be free to operate the mobile electronic device more easily.

Please refer to FIG. 1 which shows a conventional holder common in market. The conventional holder 1 includes a holding part 11, a support 13 and at least one clamping part 15. The holding part 11 is disposed on a front end of the conventional holder 1 and has a structure matching with a holding seat (not shown in FIG. 1), so the holding part 11 can be combined with the holding seat to hold a mobile electronic device (not shown in FIG. 1). The support 13 is fastened with a rear end of the conventional holder 1 near a lower edge of the conventional holder 1. The clamping part 15 is fastened with the rear end of the conventional holder 1 and near an upper edge of the conventional holder 1. The clamping part 15 is a one-piece structure made of fiber reinforced plastic material and has a front end formed with a clamping head 151. The clamping head 151 has a hook tip end of which an upper portion and a lower portion correspond to each other. By clamping the clamping head 151 on a wind guiding plate 19 of a car vent 17, the conventional holder 1 can be positioned at a fixed location and the support 13 can be used to disperse the force and torque applied by the conventional holder 1 and the mobile electronic device on the wind guiding plate 19.

Therefore, the user can fix the mobile electronic device on the conventional holder 1 to solve the problem that the mobile electronic device must be held by user's hand for operation. The conventional holder 1 can hold the mobile electronic device, but it still has some disadvantages to be solved while in use.

Firstly, it is not convenient to use the conventional holder 1. The clamping part 15 is a one-piece structure made of fiber reinforced plastic material and has weaker clamping force, so the clamping head 151 is designed in a shape of the hook tip end of which an upper portion and a lower portion correspond to each other, for fastening to compensate the insufficient clamping force of the clamping part 15. However, when the user clamps the conventional holder 1 on the wind guiding plate 19, the hook tip end of the clamping head 151 is susceptible to hook other object, so it is inconvenient for the user to assemble or disassemble the conventional holder 1.

Secondly, the convention holder 1 just has a limited angle for installation. The clamping part 15 and the support 13 are fastened on the conventional holder 1, so it is hard to firmly fasten the conventional holder 1 on the car vents 17 of which the wind guiding plates 19 has different design angles (such as a horizontal or vertical angle).

Thirdly, it is not easy to adjust the operation of the conventional holder 1. Except for the holding part 11, the conventional holder 1 has no rotatable part for adjustment. However, the rotatable range of the holding part 11 for adjustment is limited, so it is hard for the user to adjust the conventional holder 1 to an appropriate position upon personal demand.

How to solve the aforesaid shortcomings of the conventional holder to enable the holder to be easily fastened and clamped to a plate with different angles and provide the user to adjust the holder to an appropriate angle for easy access upon personal demand, become an important issue for the holder manufacturer.

BRIEF SUMMARY OF THE INVENTION

An exemplary embodiment of the present disclosure provides a holder having an adjustable clamping orientation. By the holder, a mobile electronic device (such as smartphone) can be firmly positioned on a plate of an object (such as a wind guiding plate of a car vent). The holder includes a clamping assembly, a support assembly and a holding seat. The clamping assembly has a first clamping plate extended forwardly from a front end thereof, and the first clamping plate is movably connected with a second clamping plate at a side thereof, so that the first clamping plate and the front end of the second clamping plate form a clamping head to clamp the plate. The support assembly has a front end pivoted to a rear end of the clamping assembly and a side edge pivoted to a support arm extended therefrom. A pivoting shaft between the support arm and the support assembly is vertical with a pivoting shaft between the support assembly and the clamping assembly, so that the clamping assembly is rotatable relative to the support assembly, the clamping head can firmly clamp the plate having different angles (such as a horizontal or vertical angle), a free end of the support arm is rotatable in a direction of away from or close to the clamping assembly. When the clamping head is clamped and positioned at the plate, the free end of the support arm can be abutted with a lower edge of the object to disperse the force and torque applied by the support assembly and the clamping assembly on the plate. A front end of the holding seat is rotatably fastened with a rear end of the support assembly, and the holding seat is formed with a positioning member disposed at a rear end thereof, so that the mobile electronic device can be firmly positioned at the rear end of the holding seat by the positioning member. Therefore, by means of the design of the clamping head, the holder can be fastened at the various plates having different angles, so that the user can control and watch the mobile electronic device with an appropriate angle, and the convenience in installing and using both is greatly improved. In addition, the free end of the support arm can be abutted with the lower edge of the object, the forces and torques applied by the clamping assembly, the support assembly, the holding seat and the mobile electronic device on the plate can be effectively dispersed, so the plate can be protected from being damaged subjected to an excessive applied force, and the mobile electronic device can be firmly positioned in better orientation for convenient control and watch.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
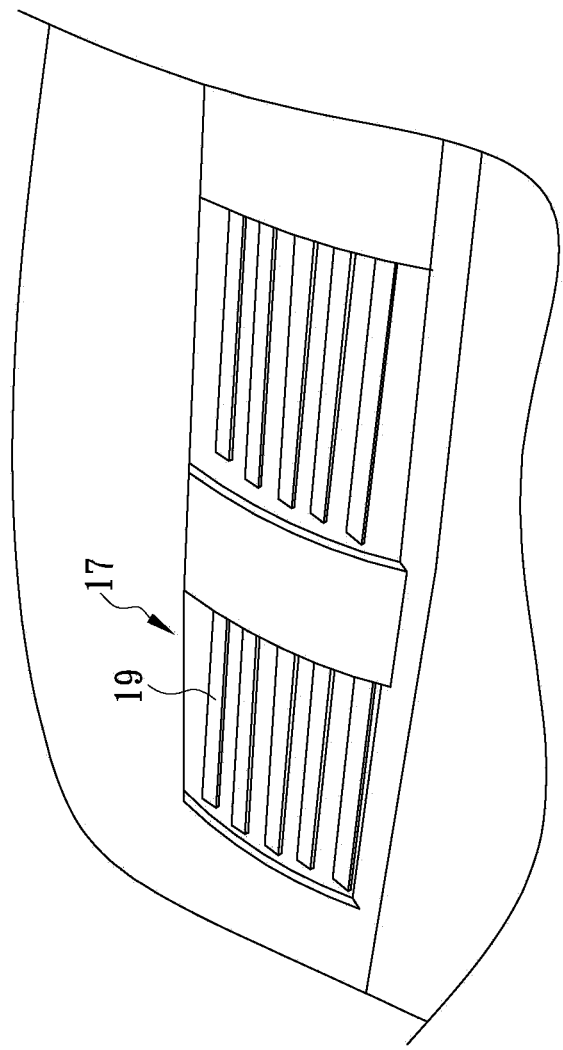
FIG. 1 is a schematic view of a conventional holder.
Figure 1:
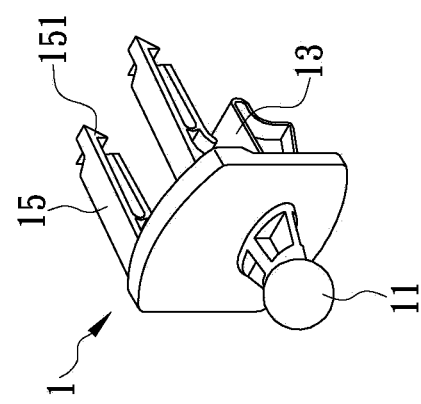

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
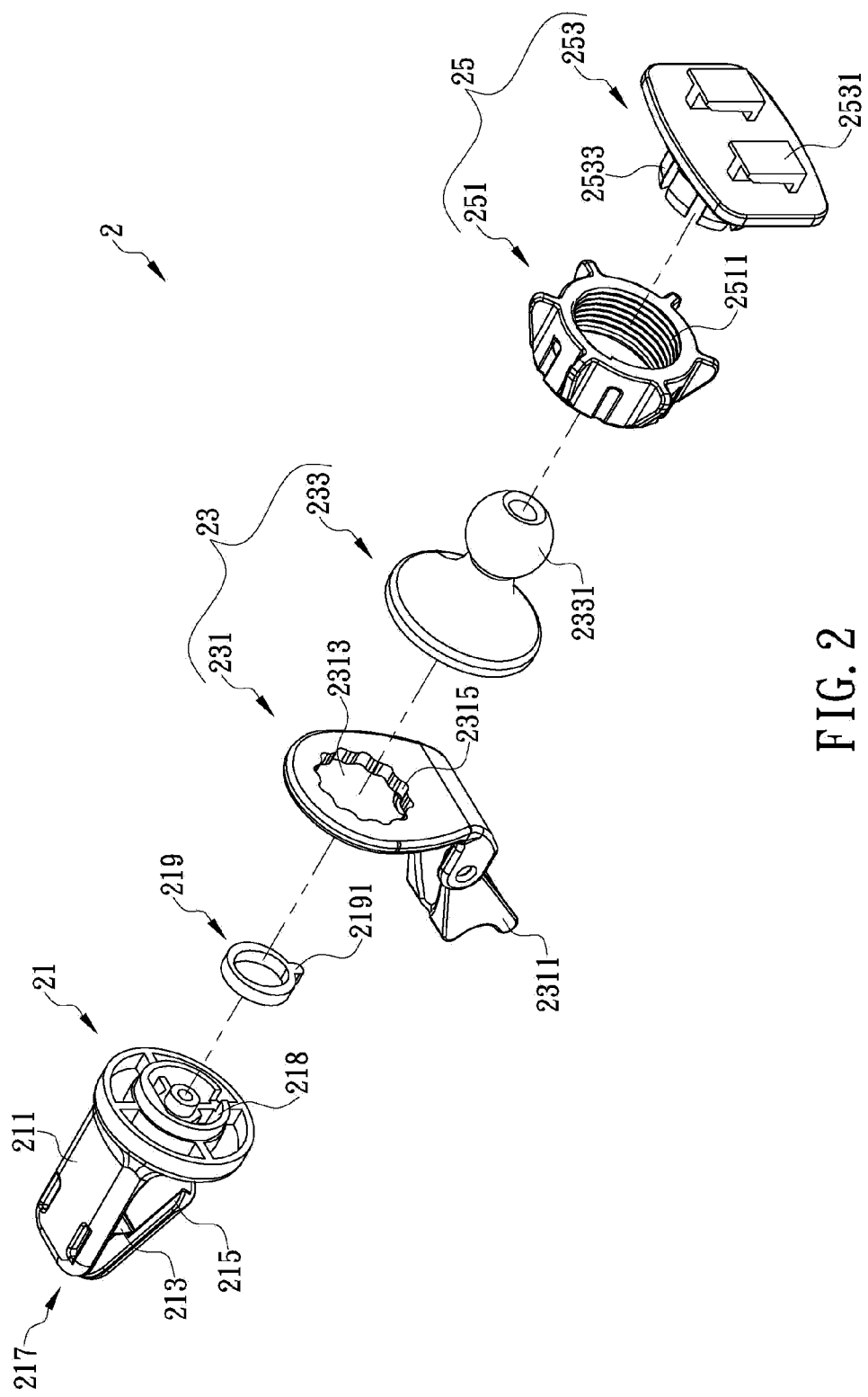
FIG. 2 is a schematic view of a structure of a holder of the present invention.
Figure 3:
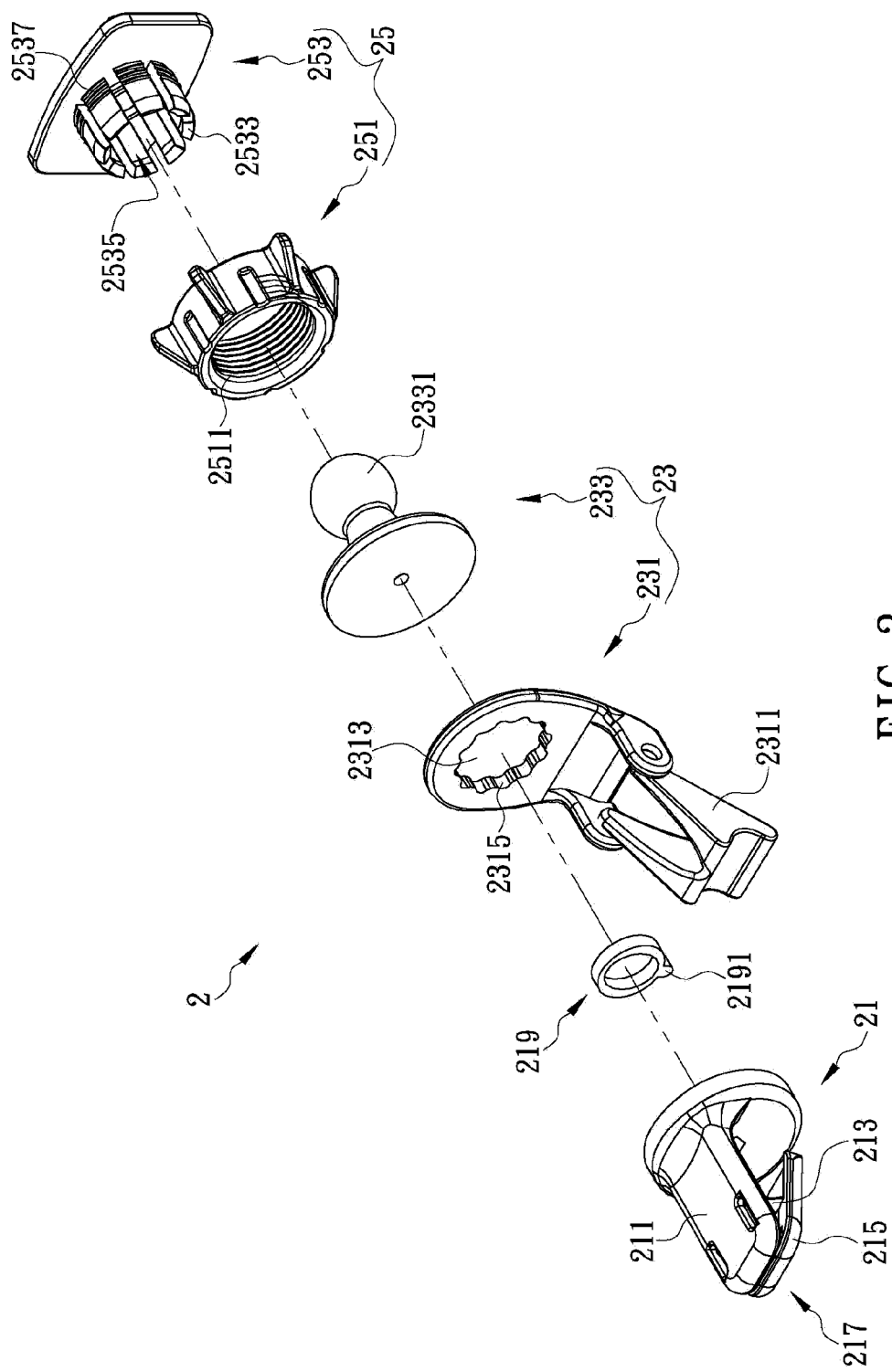
FIG. 3 is a schematic view of the structure of the holder of the present invention, when viewed from another angle.

The present invention illustrates a holder having an adjustable clamping orientation. By the holder, a mobile electronic device (such as smartphone) can be firmly positioned on a plate of an object (such as a wind guiding plate of a car vent). Pease refer to FIGS. 2 and 3. In a preferred embodiment of the present invention, the holder 2 includes a clamping assembly 21, a support assembly 23 and a holding seat 25. The clamping assembly 21 has a first clamping plate 211 extended forwardly from a front end thereof, and the first clamping plate 211 is movably connected with a second clamping plate 215 at a side thereof, so that the first clamping plate 211 and the front end of the second clamping plate 215 form a clamping head 217 to clamp the plate.

Please refer back to FIGS. 2 and 3. In this embodiment, a side of the first clamping plate 211 is fastened with a side of an elastic clamp 213, and other side of the elastic clamp 213 is fastened with the second clamping plate 215, so that the clamping head 217 is formed by the cooperation between the first clamping plate 211 and the front end of the second clamping plate 215. The elastic clamp 213 is made of metal. Preferably, the elastic clamp 213 is a one-piece steel spring clip. It should be noted that, in practical, the manufacturer can pivot the first clamping plate 211 with an end of the second clamping plate 215 away from the clamping head 217 and dispose a spring between the first and second clamping plates 211 and 215; alternatively, the provider can fasten a sheet, which is made of metal or fiber reinforced plastic, between the first and second clamping plates 211 and 215 integrally to form the clamping head 217.

Please refer back to FIGS. 2 and 3. A front end of the support assembly 23 is pivoted to a rear end of the clamping assembly 21. In this embodiment, the support assembly 23 includes a first support 231 and a second support 233, the first support 231 is formed with a support arm 2311 extended from and pivoted to a side edge thereof, a pivoting shaft between the support arm 2311 and the support assembly 23 is vertical with a pivoting shaft between the support assembly 23 and the clamping assembly 21, so that the clamping assembly 21 is rotatable relative to the support assembly 23, the clamping head 217 can firmly clamp the plate having different angles (such as a horizontal or vertical angle), a free end of the support arm 2311 is rotatable in a direction of away from or close to the clamping assembly 21. Therefore, when the clamping head 217 is clamped and positioned on the plate, the free end of the support arm 2311 can be abutted with a lower edge of the object to disperse the force and torque applied by the support assembly 23 and the clamping assembly 21 on the plate. The second support 233 is formed with a support ball 2331 disposed at rear end thereof, and the second support 233 and the clamping assembly 21 are connected integrally, so that the first support 231 is clamped between the second support 233 and the clamping assembly 21, and rotatable relative to the second support 233 and the support assembly 23. It should be noted that, in practical, the manufacturer can produce the support assembly 23 by a one-piece forming manner.

Please refer back to FIGS. 2 and 3. A front end of the holding seat 25 is rotatably fastened with the rear end of the support assembly 23, and the holding seat 25 is formed with a positioning member 2531 disposed at a rear end thereof, so that the mobile electronic device can be firmly positioned at the rear end of the holding seat 25 by the positioning member 2531.

Therefore, by means of the design of the clamping head 217, the holder 2 can be fastened at the various plates having different angles, so that the user can control and watch the mobile electronic device with an appropriate angle, and the convenience in installing and using both is greatly improved. In addition, the free end of the support arm 2311 can be abutted with the lower edge of the object, the force and torque applied by the clamping assembly 21, the support assembly 23, the holding seat 25 and the mobile electronic device on the plate is effectively dispersed, so the plate can be protected from being damaged subjected to an excessive applied force, and the mobile electronic device can be firmly positioned in better orientation for convenient control and watch.

Please refer back to FIG. 2. In other preferred embodiment of the present invention, the clamping assembly 21 is further formed with an engagement part 218 protruded at the rear end thereof and configured to engage with a fastening member 219. A protrusion 2191 of the fastening member 219 is exposed out of the engagement part 218 through a gap of the engagement part 218, and the support assembly 23 is formed with an engagement opening 2313 inside. The engagement opening 2313 has a structure matching with that of the engagement part 218, so the engagement part 218 can be pivoted into the engagement opening 2313. The engagement opening 2313 is provided with a plurality of fastening slots 2315 annularly formed on an inner edge thereof. In a condition that the engagement part 218 is pivoted into the engagement opening 2313, the protrusion 2191 is respectively fastened into one of the fastening slots 2315 corresponding thereto. In a condition that the clamping assembly 21 is rotated, the protrusion 2191 is fastened into other fastening slot 2315 along with the rotation of the fastening member 219, so that the clamping assembly 21 can be firmly positioned with a usage angle.

Figure 4:
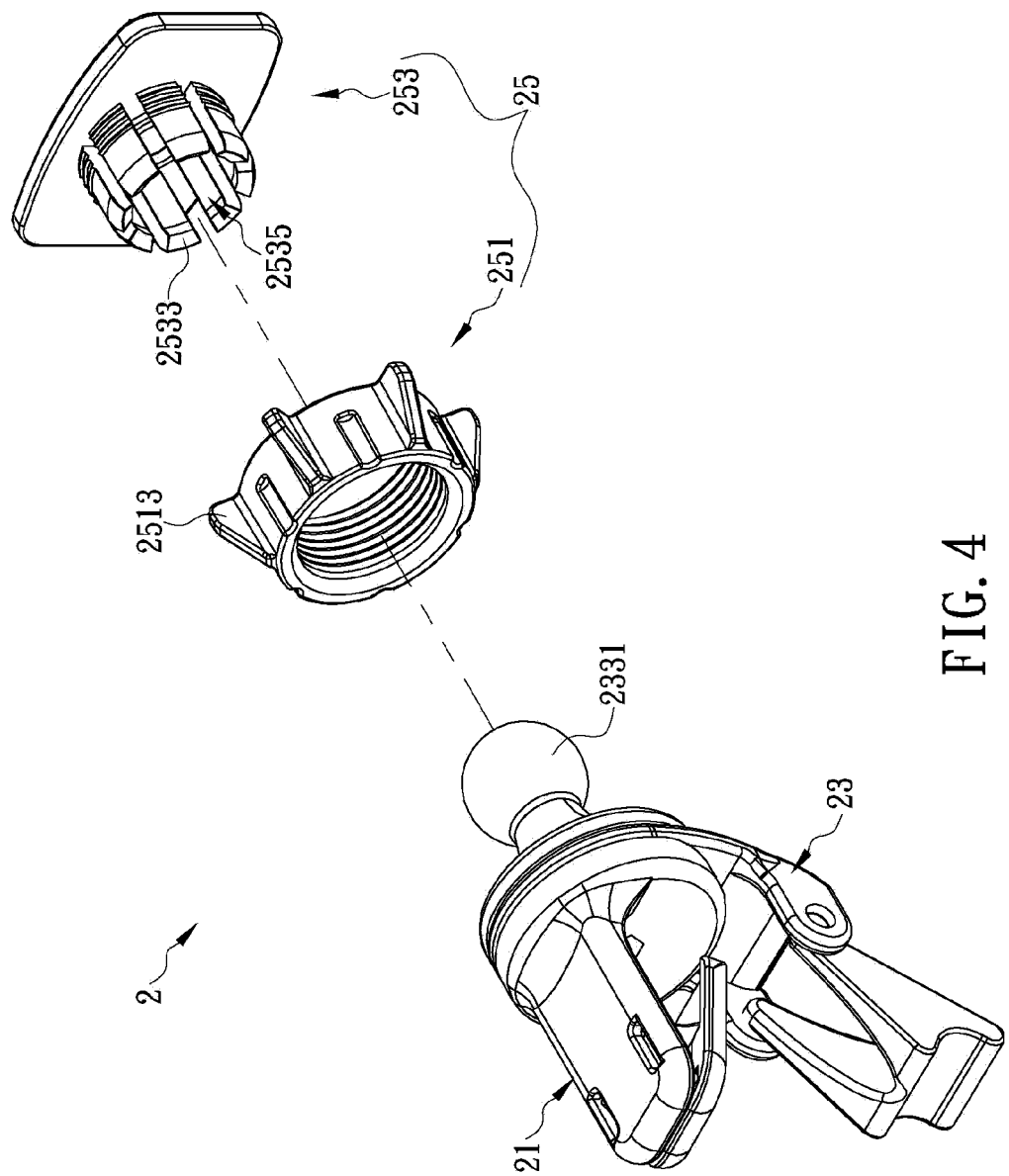
FIG. 4 is a schematic assembly view of the holder of the present invention.

Please refer back to FIGS. 2 and 3. In other preferred embodiment of the present invention, the holding seat 25 further includes a lock ring 251 and a positioning member 253. The lock ring 251 has an inner thread 2511 formed on an inner wall thereof, the positioning member 253 has a plurality of lock plates 2533 which are annularly disposed on a front end thereof and arranged in interval, and define a receiving space therebetween. The shape of the receiving space 2535 matches with that of the support ball 2331. The lock plates 2533 are formed with an outer thread 2537 at outer walls thereof, and the outer thread 2537 matches with the inner thread 2511. Please refer to FIG. 4. When the lock plates 2533 are inserted through the lock ring 251 and the support ball 2331 is positioned into the receiving space 2535, the user can rotate the lock ring 251 to lock the lock plate 2533 with the support ball 2331 tightly, thereby integrally combining the holding seat 25 and the support assembly 23 firmly. When the lock ring 251 is rotated to loosen, the user can adjust relative locations and angles of the holding seat 25 and the support assembly 23.

Please refer back to FIG. 4. In alternative preferred embodiment of the present invention, the lock ring 251 is formed with a plurality of rotating-aid blocks 2513 disposed at an outer wall thereof to facilitate the user to rotate the lock ring 251 by smaller force.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A holder having an adjustable clamping orientation, for firmly positioning a mobile electronic device on a plate of an object, and the holder comprising:
    a clamping assembly, comprising a first clamping plate extended forwardly from a front end thereof, a side of the first clamping plate movably connected with a second clamping plate, and the first clamping plate and the front end of the second clamping plate cooperatively forming a clamping head to clamp the plate;
    a support assembly, having a front end pivoted to a rear end of the clamping assembly and a side edge pivoted with a support arm extended therefrom, wherein a pivoting shaft between the support arm and the support assembly is vertical with a pivoting shaft between the support assembly and the clamping assembly, so as to enable the clamping assembly to be rotatable relative to the support assembly and enable a free end of the support arm to be rotatable away from or close to the clamping assembly, whereby the free end of the support arm is abutted with a lower edge of the object while the clamping head is clamped and positioned on the plate; and
    a holding seat, having a front end rotatably fastened with a rear end of the support assembly, and comprising a positioning member disposed at a rear end thereof, so as to firmly position the mobile electronic device at the rear end of the holding seat.

2. The holder according to claim 1, wherein a side of the first clamping plate is fastened with a side of an elastic clamp, and other side of the elastic clamp is fastened with the second clamping plate.

3. The holder according to claim 1, wherein the first clamping plate and an end of the second clamping plate away from the clamping head are pivoted with each other, and a spring is disposed between the first clamping plate and the end of the second clamping plate.

4. The holder according to claim 1, wherein the clamping assembly is further formed with an engagement part protruded at the rear end thereof and configured to engage with a fastening member having a protrusion exposed out of the engagement part through a gap of the engagement part, and the support assembly is formed with an engagement opening inside the front end thereof, a structure of the engagement opening matches with that of the engagement part to enable the engagement part to be pivoted into the engagement opening, the engagement opening is formed with a plurality of fastening slots;
    wherein in a condition that the engagement part is pivoted into the engagement opening, the protrusion is respectively fastened into one of the fastening slots corresponding thereto, and in a condition that the clamping assembly is rotated, the protrusion is respectively fastened into other fastening slot along with the rotation of the fastening member.

5. The holder according to claim 2, wherein the clamping assembly is further formed with an engagement part protruded at the rear end thereof and configured to engage with a fastening member having a protrusion exposed out of the engagement part through a gap of the engagement part, and the support assembly is formed with an engagement opening inside the front end thereof, a structure of the engagement opening matches with that of the engagement part to enable the engagement part to be pivoted into the engagement opening, the engagement opening is formed with a plurality of fastening slots;
    wherein in a condition that the engagement part is pivoted into the engagement opening, the protrusion is respectively fastened into one of the fastening slots corresponding thereto, and in a condition that the clamping assembly is rotated, the protrusion is respectively fastened into other fastening slot along with the rotation of the fastening member.

6. The holder according to claim 3, wherein the clamping assembly is further formed with an engagement part protruded at the rear end thereof and configured to engage with a fastening member having a protrusion exposed out of the engagement part through a gap of the engagement part, and the support assembly is formed with an engagement opening inside the front end thereof, a structure of the engagement opening matches with that of the engagement part to enable the engagement part to be pivoted into the engagement opening, the engagement opening is formed with a plurality of fastening slots;
    wherein in a condition that the engagement part is pivoted into the engagement opening, the protrusion is respectively fastened into one of the fastening slots corresponding thereto, and in a condition that the clamping assembly is rotated, the protrusion is respectively fastened into other fastening slot along with the rotation of the fastening member.

7. The holder according to claim 4, wherein the support assembly further comprises a support ball disposed and protruded at rear end thereof, the holding seat further comprises a lock ring and a positioning member, the lock ring has an inner thread formed on an inner wall thereof, the positioning member has a plurality of lock plates which are annularly disposed on a front end thereof, arranged in interval and define a receiving space therebetween, the shape of the receiving space matches with that of the support ball, and the lock plates are formed with an outer thread at outer walls thereof, and the outer thread matches with the inner thread;

wherein when the lock plates are inserted through the lock ring and the support ball is positioned into the receiving space, the lock ring is rotated to lock the lock plates with the support ball tightly, thereby integrally combining the holding seat and the support assembly firmly;

wherein when the lock ring is rotated to loosen, relative locations and angles of the holding seat and the support assembly are adjustable.

8. The holder according to claim 5, wherein the support assembly further comprises a support ball disposed and protruded at rear end thereof, the holding seat further comprises a lock ring and a positioning member, the lock ring has an inner thread formed on an inner wall thereof, the positioning member has a plurality of lock plates which are annularly disposed on a front end thereof, arranged in interval and define a receiving space therebetween, the shape of the receiving space matches with that of the support ball, and the lock plates are formed with an outer thread at outer walls thereof, and the outer thread matches with the inner thread;

wherein when the lock plates are inserted through the lock ring and the support ball is positioned into the receiving space, the lock ring is rotated to lock the lock plates with the support ball tightly, thereby integrally combining the holding seat and the support assembly firmly;

wherein when the lock ring is rotated to loosen, relative locations and angles of the holding seat and the support assembly are adjustable.

9. The holder according to claim 6, wherein the support assembly further comprises a support ball disposed and protruded at rear end thereof, the holding seat further comprises a lock ring and a positioning member, the lock ring has an inner thread formed on an inner wall thereof, the positioning member has a plurality of lock plates which are annularly disposed on a front end thereof, arranged in interval and define a receiving space therebetween, the shape of the receiving space matches with that of the support ball, and the lock plates are formed with an outer thread at outer walls thereof, and the outer thread matches with the inner thread;

wherein when the lock plates are inserted through the lock ring and the support ball is positioned into the receiving space, the lock ring is rotated to lock the lock plates with the support ball tightly, thereby integrally combining the holding seat and the support assembly firmly;

wherein when the lock ring is rotated to loosen, relative locations and angles of the holding seat and the support assembly are adjustable.

10. The holder according to claim 7, wherein the support assembly comprises a first support and a second support, the first support is formed with the support arm extended from and pivoted on a side edge thereof, the second support is formed with the support ball disposed at rear end thereof, and the second support and the clamping assembly are connected integrally, whereby the first support is clamped between the second support and the clamping assembly and rotatable relative to the second support and the support assembly.

11. The holder according to claim 8, wherein the support assembly comprises a first support and a second support, the first support is formed with the support arm extended from and pivoted on a side edge thereof, the second support is formed with the support ball disposed at rear end thereof, and the second support and the clamping assembly are connected integrally, whereby the first support is clamped between the second support and the clamping assembly and rotatable relative to the second support and the support assembly.

12. The holder according to claim 9, wherein the support assembly comprises a first support and a second support, the first support is formed with the support arm extended from and pivoted on a side edge thereof, the second support is formed with the support ball disposed at rear end thereof, and the second support and the clamping assembly are connected integrally, whereby the first support is clamped between the second support and the clamping assembly and rotatable relative to the second support and the support assembly.

13. The holder according to claim 10, wherein the elastic clamp is a one-piece steel spring clip.

14. The holder according to claim 11, wherein the elastic clamp is a one-piece steel spring clip.

15. The holder according to claim 12, wherein the elastic clamp is a one-piece steel spring clip.

16. The holder according to claim 13, wherein the lock ring is formed with a plurality of rotating-aid blocks disposed at an outer wall thereof.

17. The holder according to claim 14, wherein the lock ring is formed with a plurality of rotating-aid blocks disposed at an outer wall thereof.

18. The holder according to claim 15, wherein the lock ring is formed with a plurality of rotating-aid blocks disposed at an outer wall thereof.

* * * * *